United States Patent
Majidi et al.

(10) Patent No.: US 10,720,261 B2
(45) Date of Patent: Jul. 21, 2020

(54) POLYMER COMPOSITE WITH LIQUID PHASE METAL INCLUSIONS

(71) Applicant: CARNEGIE MELLON UNIVERSITY, Pittsburgh, PA (US)

(72) Inventors: Carmel Majidi, Pittsburgh, PA (US); Andrew Fassler, Pittsburgh, PA (US); Michael Bartlett, Pittsburgh, PA (US); Navid Kazem, Pittsburgh, PA (US); Matthew J. Powell-Palm, Pittsburgh, PA (US); Jonathan A. Malen, Pittsburgh, PA (US)

(73) Assignee: CARNEGIE MELLON UNIVERSITY, a Pennsylvania Non-Profit Corporation, Pittsburgh, PA (US)

( * ) Notice: Subject to any disclaimer, the term of this patent is extended or adjusted under 35 U.S.C. 154(b) by 96 days.

Patent file contains an affidavit/declaration under 37 CFR 1.130(b).

(21) Appl. No.: 15/423,538

(22) Filed: Feb. 2, 2017

(65) Prior Publication Data

US 2017/0218167 A1 Aug. 3, 2017

Related U.S. Application Data

(60) Provisional application No. 62/388,614, filed on Feb. 2, 2016, provisional application No. 62/496,288, filed on Oct. 10, 2016.

(51) Int. Cl.
| | |
|---|---|
| *C08K 3/10* | (2018.01) |
| *H01B 1/22* | (2006.01) |
| *G03F 7/00* | (2006.01) |
| *C08K 3/08* | (2006.01) |
| *C08L 21/00* | (2006.01) |

(52) U.S. Cl.
CPC ............. *H01B 1/22* (2013.01); *C08K 3/08* (2013.01); *C08K 3/10* (2013.01); *C08K 2201/001* (2013.01); *C08L 21/00* (2013.01); *G03F 7/0002* (2013.01)

(58) Field of Classification Search
None
See application file for complete search history.

(56) References Cited

U.S. PATENT DOCUMENTS

| | | | | |
|---|---|---|---|---|
| 5,445,308 A | * | 8/1995 | Nelson | C09J 9/02 228/121 |
| 6,658,861 B1 | * | 12/2003 | Ghoshal | F04B 17/00 257/E23.098 |
| 6,797,758 B2 | * | 9/2004 | Misra | H01B 3/301 257/E23.106 |
| 6,984,685 B2 | * | 1/2006 | Misra | H01L 23/3733 257/E23.107 |
| 2003/0227959 A1 | * | 12/2003 | Balian | H01L 23/3736 374/161 |
| 2012/0118066 A1 | * | 5/2012 | Majidi | A61B 5/11 73/719 |

OTHER PUBLICATIONS

Fassler et al. Liquid-Phase Metal Inclusions for a Conductive Polymer Composite. Adv. Mater, 2015, 27, 1928-1932 (Year: 2015).*
Boley et al. Mechanically Sintered Gallium-Indium Nanoparticles. Adv. Mater, 2015, 27, 2355-2360 (Year: 2015).*
Jawed et al. Soft-Matter Electronics and Multifunctional Materials with Polydisperse Liquid Metal Suspensions. 2017 IEEE International Symposium on Antennas and Propagation & USNC/URSI National Radio Science Meeting, CA, 417-418 (Year: 2017).*
Jeong et al. Mechanically Stretchable and Electrically Insulating Thermal Elastomer Composite by Liquid Alloy Droplet Embedment. Scientific Reports, 5:18257, pp. 1-10 (Year: 2015).*
Cheng et al. Liquid metal stretchable unbalanced loop antenna. Appl. Phys. Lett. 94, 144103 (Year: 2009).*
Bruggeman, Von Dag. "Berechnung verschiedener physikalischer Konstanten von heterogenen Substanzen. I. Dielektrizitätskonstanten und Leitfähigkeiten der Mischkörper aus isotropen Substanzen." Annalen der physik 416, No. 7 (1935): 636-664.
Jeffrey, David J. "Conduction through a random suspension of spheres." In Proceedings of the Royal Society of London A: Mathematical, Physical and Engineering Sciences, vol. 335, No. 1602, pp. 355-367. The Royal Society, 1973.
McKenzie, D. R. et al. "Exact modelling of cubic lattice permittivity and conductivity." Nature 265, No. 5590 (1977): 128-129.
C.-W. Nan et al., J. Appl. Phys. 1997, 81, 6692.
Eshelby, John D. "The determination of the elastic field of an ellipsoidal inclusion, and related problems." In Proceedings of the Royal Society of London A: Mathematical, Physical and Engineering Sciences, vol. 241, No. 1226, pp. 376-396. The Royal Society, 1957.
Li, C. et al. "Determining elastic properties of skin by measuring surface waves from an impulse mechanical stimulus using phase-sensitive optical coherence tomography." Journal of the Royal Society Interface 9, No. 70 (2012): 831-841.
Diani, J. et al. "A review on the Mullins effect." European Polymer Journal 45, No. 3 (2009): 601-612.
Ashby, M. F. et al. "The mechanical properties of natural materials. I. Material property charts." In Proceedings of the Royal Society of London A: Mathematical, Physical and Engineering Sciences, vol. 450, No. 1938, pp. 123-140. The Royal Society, 1995.
Kim, Dae-Hyeong, et al. "Epidermal electronics." Science 333, No. 6044 (2011): 838-843.
Xu, L. et al. "3D multifunctional integumentary membranes for spatiotemporal cardiac measurements and stimulation across the entire epicardium." Nature communications 5 (2014): 3329.

(Continued)

*Primary Examiner* — Tanisha Diggs
(74) *Attorney, Agent, or Firm* — Michael G. Monyok

(57) ABSTRACT

Disclosed herein is a composite comprising an elastomer with an embedded network of liquid metal inclusions. The composite retains similar flexibility to that of an elastomer but exhibits electrical and thermal properties that differ from the properties of a homogeneous elastomer. The composite has applications for wearable devices and other soft matter electronics, among others.

18 Claims, 15 Drawing Sheets

(56) References Cited

OTHER PUBLICATIONS

Xu, S. et al. "Stretchable batteries with self-similar serpentine interconnects and integrated wireless recharging systems." Nat. Commun. 4, No. 1543 (2013).

Jung, I. et al. Proc. Natl. Acad. Sci., 2011, 108, 2011.

Park, Yong-Lae et al. "Hyperelastic pressure sensing with a liquid-embedded elastomer." Journal of Micromechanics and Microengineering 20, No. 12 (2010): 125029.

Fassler, A. et al. "Soft-matter capacitors and inductors for hyperelastic strain sensing and stretchable electronics." Smart Materials and Structures 22, No. 5 (2013): 055023.

Majidi, C. et al. "A non-differential elastomer curvature sensor for softer-than-skin electronics." Smart Materials and Structures 20, No. 10 (2011): 105017.

Hayes, G. J. et al. "Flexible liquid metal alloy (EGaIn) microstrip patch antenna." IEEE Transactions on Antennas and Propagation 60, No. 5 (2012): 2151-2156.

Cheng, S. et al. "Microfluidic electronics." Lab on a Chip 12, No. 16 (2012): 2782-2791.

Finkenauer, L. R. et al. "Complaint liquid metal electrodes for dielectric elastomer actuators." In Electroactive Polymer Actuators and Devices (EAPAD) 2014, vol. 9056, p. 90563I. International Society for Optics and Photonics, 2014.

Khan, M. R. et al. "Giant and switchable surface activity of liquid metal via surface oxidation." Proceedings of the National Academy of Sciences 111, No. 39 (2014): 14047-14051.

Verdejo, R. et al. "Graphene filled polymer nanocomposites." Journal of Materials Chemistry 21, No. 10 (2011): 3301-3310.

Xu, Q. et al. "Effect of oxidation on the mechanical properties of liquid gallium and eutectic gallium-indium." Physics of Fluids 24, No. 6 (2012): 063101.

Larsen, R. J. et al. "Viscoelastic properties of oxide-coated liquid metals." Journal of rheology 53, No. 6 (2009): 1305-1326.

Dickey, M. D. et al. "Eutectic gallium-indium (EGaIn): a liquid metal alloy for the formation of stable structures in microchannels at room temperature." Advanced Functional Materials 18, No. 7 (2008): 1097-1104.

Tabatabai, A. et al. "Liquid-phase gallium-indium alloy electronics with microcontact printing." Langmuir 29, No. 20 (2013):6194-6200.

So, Ju-Hee et al. "Inherently aligned microfluidic electrodes composed of liquid metal." Lab on a Chip 11, No. 5 (2011): 905-911.

Ladd, C. et al. "3D printing of free standing liquid metal microstructures." Advanced Materials 25, No. 36 (2013): 5081-5085.

Knite, M. et al. "Polyisoprene-carbon black nanocomposites as tensile strain and pressure sensor materials." Sensors and Actuators A: Physical 110, No. 1 (2004): 142-149.

Kaskela, A. et al. "Aerosol-synthesized SWCNT networks with tunable conductivity and transparency by a dry transfer technique." Nano letters 10, No. 11 (2010): 4349-4355.

Chen, M. et al. "Highly conductive and stretchable polymer composites based on graphene/MWCNT network." Chemical Communications 49, No. 16 (2013): 1612-1614.

Lipomi, D. J. et al. "Skin-like pressure and strain sensors based on transparent elastic films of carbon nanotubes." Nature nanotechnology 6, No. 12 (2011): 788-792.

Chun, Kyoung-Yong et al. "Highly conductive, printable and stretchable composite films of carbon nanotubes and silver." Nature nanotechnology 5, No. 12 (2010): 853-857.

Park, M. et al. "Highly stretchable electric circuits from a composite material of silver nanoparticles and elastomeric fibres." Nature nanotechnology 7, No. 12 (2012): 803-809.

Merilampi, S. et al. "Analysis of electrically conductive silver ink on stretchable substrates under tensile load." Microelectronics Reliability 50, No. 12 (2010): 2001-2011.

Akter, T. et al. "Reversibly stretchable transparent conductive coatings of spray-deposited silver nanowires." ACS applied materials & interfaces 4, No. 4 (2012): 1855-1859.

Fu, Shao-Yun et al. "Effects of particle size, particle/matrix interface adhesion and particle loading on mechanical properties of particulate-polymer composites." Composites Part B: Engineering 39, No. 6 (2008): 933-961.

Ahmed, S. et al. "A review of particulate reinforcement theories for polymer composites." Journal of Materials Science 25, No. 12 (1990): 4933-4942.

Blaiszik, B. J. et al. "Autonomic restoration of electrical conductivity." Advanced Materials 24, No. 3 (2012): 398-401.

Park, J. et al. "Three-dimensional nanonetworks for giant stretchability in dielectrics and conductors." Nature communications 3 (2012): 916.

Johnston, I. D., et al. Journal of Micromechanics and Microengineering, Jan. 24, 2014.

Kaltenbrunner, M. et al. "An ultra-lightweight design for imperceptible plastic electronics." Nature 499, No. 7459 (2013): 458-463.

Majidi, Carmel. "Soft robotics: a perspective—current trends and prospects for the future." Soft Robotics 1, No. 1 (2014): 5-11.

Shepherd, R. F. et al. "Multigait soft robot." Proceedings of the National Academy of Sciences 108, No. 51 (2011): 20400-20403.

Koh, S. J. A. et al. "Maximal energy that can be converted by a dielectric elastomer generator." Applied Physics Letters 94, No. 26 (2009): 262902.

Niu, X. Z., et al. "Characterizing and patterning of PDMS-based conducting composites." Advanced Materials 19, No. 18 (2007): 2682-2686.

Hammock, M. L. et al. "25th anniversary article: the evolution of electronic skin (e-skin): a brief history, design considerations, and recent progress." Advanced Materials 25, No. 42 (2013): 5997-6038.

Dang, Zhi-Min et al. "Fundamentals, processes and applications of high-permittivity polymer-matrix composites." Progress in Materials Science 57, No. 4 (2012): 660-723.

Shakun, A. "Soft elastomeric material with improved dielectric permittivity." (2014).

Gallone, G. et al. "Dielectric constant enhancement in a silicone elastomer filled with lead magnesium niobate-lead titanate." Materials Science and Engineering: C 27, No. 1 (2007): 110-116.

Carpi, F. et al. "Improvement of electromechanical actuating performances of a silicone dielectric elastomer by dispersion of titanium dioxide powder." IEEE Transactions on Dielectrics and Electrical Insulation 12, No. 4 (2005): 835-843.

Bokobza, L. et al. "Effect of strain on the properties of a styrene-butadiene rubber filled with multiwall carbon nanotubes." Journal of applied polymer science 105, No. 4 (2007): 2054-2061.

Style, R. W. et al. "Stiffening solids with liquid inclusions." Nature Physics 11, No. 1 (2015): 82-87.

Cho, J. et al. "Effect of inclusion size on mechanical properties of polymeric composites with micro and nano particles." Composites Science and Technology 66, No. 13 (2006): 1941-1952.

Fassler, A. et al. "Liquid-Phase Metal Inclusions for a Conductive Polymer Composite." Advanced Materials 27, No. 11 (2015): 1928-1932.

Chiechi, R. C. et al. "Eutectic Gallium-Indium (EGaIn): A Moldable Liquid Metal for Electrical Characterization of Self-Assembled Monolayers." Angewandte Chemie 120, No. 1 (2008): 148-150.

Joshipura, I. D. et al. "Methods to pattern liquid metals." Journal of Materials Chemistry C 3, No. 16 (2015): 3834-3841.

* cited by examiner

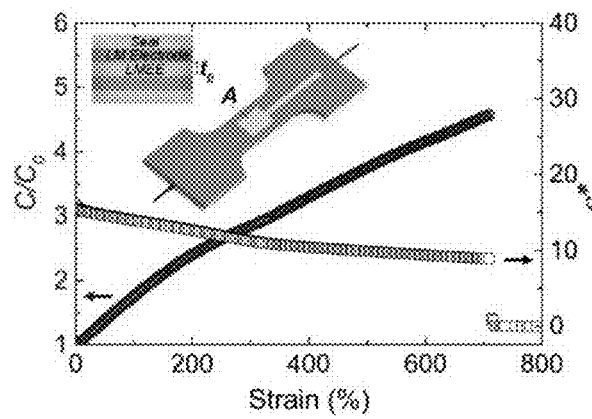
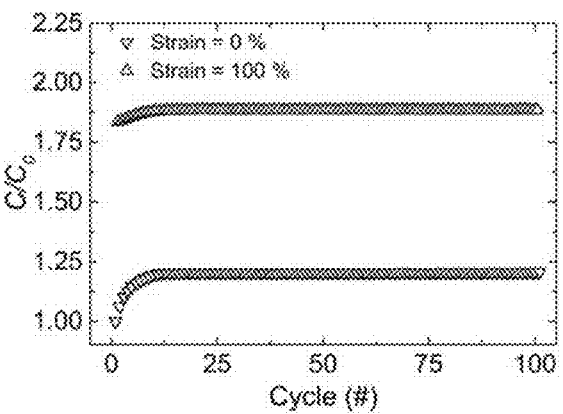
FIG. 11A
FIG. 11B
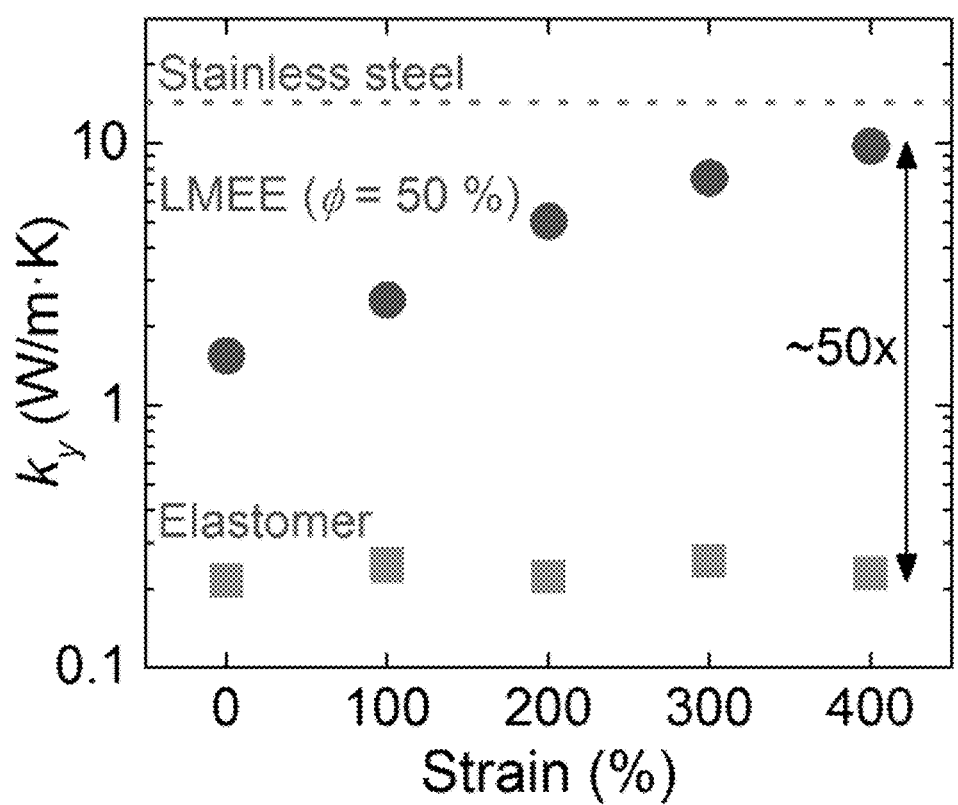
FIG. 12

POLYMER COMPOSITE WITH LIQUID PHASE METAL INCLUSIONS

CROSS-REFERENCE TO RELATED APPLICATIONS

This application claims the benefit under 35 U.S.C. §119 of Provisional Application Ser. No. 62/388,614, filed Feb. 2, 2016, and Provisional Application Ser. No. 62/496,288, filed Oct. 10, 2016, each of which is incorporated herein by reference.

STATEMENT REGARDING FEDERALLY SPONSORED RESEARCH

This invention was made with government support under AFOSR No. FA9550-13-1-0123 and NASA No. NNX14A049G. The government has certain rights in this invention.

BACKGROUND OF THE INVENTION

The invention relates generally to polymer composites. More specifically, the invention relates to a composite having liquid metal inclusions dispersed within an elastic polymer, where the composite has electrical conductivity, permittivity, and thermal conductivity properties that differ from other elastomeric materials.

High compliance (low E) and elasticity (high $\varepsilon_f$) represent key challenges in the development of mechanically robust electronics that are compatible with natural human tissue for wearable computing, implantable devices, and physical human-machine interaction. Presently, soft and stretchable functionality can be introduced through so-called "deterministic" architectures in which thin flexible circuits are bonded to an elastomer substrate and buckled or patterned into wavy/serpentine planar geometries. Alternatively, solid metal wiring can be replaced with metal alloys that are liquid at room temperature. Liquid-phase gallium-indium alloys are popular for this "microfluidics" approach to stretchable electronics since they are non-toxic and form an oxide layer that aids in microcontact printing, electrode alignment, and 3D printing. Lastly, a common approach to stretchable electronics is to embed thin films of elastomer with a percolating network of conductive particulates, such as structured carbon black or silver nanoparticles, for example. However, their volumetric conductivity is poor compared to bulk conductors and improving conductivity by increasing the weight % of conductive filler increases the mechanical stiffness and brittleness of the material.

Soft electronic systems capable of dielectric behavior are also needed for new technologies such as wearable devices. Traditionally, the electronic properties of rubbery polymers like silicones, polyurethanes, or copolymers such as styrene ethylene butylene styrene are tailored by adding 10-30% by volume of inorganic fillers such as Ag powder, Ag-coated Ni microspheres, structured carbon black (CB), exfoliated graphite, carbon nanotubes, $BaTiO_3$, $TiO_2$, or other metallic, carbon-based, or ceramic micro/nanoparticles. Although rigid particles have been incorporated into silicones, urethanes, and acrylate-based elastomers to increase their dielectric constant, the loadings required to achieve significant electric property enhancement can degrade the mechanical properties of these soft and stretchable material systems. The inherently rigid nature of the inorganic filler particles creates a dramatic compliance mismatch with the soft, stretchable elastomer matrix that leads to internal stress concentrations, delamination, and friction that increase bulk rigidity, reduces extensibility, and results in inelastic stress-strain responses that can limit long term durability at the mesoscale. Other approaches have used fluid fillers to modify mechanical properties, but the electrical properties were not enhanced.

Similarly, efficient thermal transport is critical for applications involving soft electronics. However, heat transport within soft materials is limited by the dynamics of phonon transport, which results in a trade-off between thermal conductivity and compliance. For example, materials with high thermal conductivity are typically rigid and elastically incompatible with soft and mechanically deformable systems. In the general case of non-metallic and electrically insulating solids, this limitation arises from kinetic theory and the Newton-Laplace equation, which imply that thermal conductivity (k) will increase with a material's elastic modulus (E). For polymers like polyethylene, thermal conductivity can be enhanced through macromolecular chain alignment (from k~0.3 to 100 W/m·K), but this also leads to a dramatic increase in elastic modulus from approximately 1 to 200 GPa. Likewise, glassy polymer blends have been engineered to increase thermal conductivity through interchain hydrogen bonding and relatively higher thermal conductivity has been observed in amorphous polythiophene (k~4.4 W/m·K), but the high elastic modulus (E~3 GPa) and low strain at failure (<5% strain) of films make them unsuitable for soft functional materials.

To overcome this fundamental tradeoff with thermal transport in soft materials, attempts have been made to engineer composites with various fillers, including metals, ceramics, carbon fibers, and nanomaterials such as carbon nanotubes and graphene. Although these composites exhibit increased thermal conductivity, they typically utilize rigid fillers that result in mechanically stiff materials that cannot support stretchable functionality and in the case of carbon based fillers, become electrically conductive even at low volume loadings, which can interfere with functionality. To date, the combination of low elastic modulus on the order of biological tissue, large mechanical deformability, and high thermal conductivity remains elusive.

It would therefore be advantageous to develop an elastomeric material with enhanced electrical and thermal properties, yet remains flexible.

BRIEF SUMMARY

According to embodiments of the present invention is a composite comprised of an elastomer having inclusions of a liquid metal. As a conductive filler, the liquid-phase metal alloy represents an alternative to rigid particulates and does not increase the stiffness and brittleness of the elastomeric composite. The composition of the composite eliminates the internal compliance mismatch of rigid fillers and thus preserves the mechanics of the host material, offering a unique combination of low mechanical rigidity and desirable electrical and thermal properties. These liquid-metal embedded elastomer composites can be tailored to match the elastic and rheological properties of soft synthetic materials and biological tissue to enable signal transduction, rigidity tuning, and a rich set of other functionalities for bio-compatible machines and electronics.

BRIEF DESCRIPTION OF THE SEVERAL VIEWS OF THE DRAWINGS

FIGS. 11A-11B are graphs showing electrical properties of the composite.

FIG. 12 shows the thermal conductivity of various materials at different strain percentages.

DETAILED DESCRIPTION

According to one embodiment of the present invention is a composite 101 comprising an elastomer 102 embedded with a plurality of liquid metal inclusions 103. The elastomer 102 can include materials such as polysiloxane (e.g. 'silicone', polydimethylsiloxane, RTV silicones), polyurethane, polyacrylate, natural (latex) rubber, block copolymer elastomers (e.g. styrene ethylene butylene styrene), thermoplastic elastomers (e.g. propylene-ethylene co-polymer), and other similar materials. The liquid metal 103 can include materials such as eutectic gallium indium (EGaIn), gallium-indium-tin (Galinstan), Indalloy, NewMerc, mercury, and other metals that are liquid at lower temperatures than other metals.

Figure 1A:
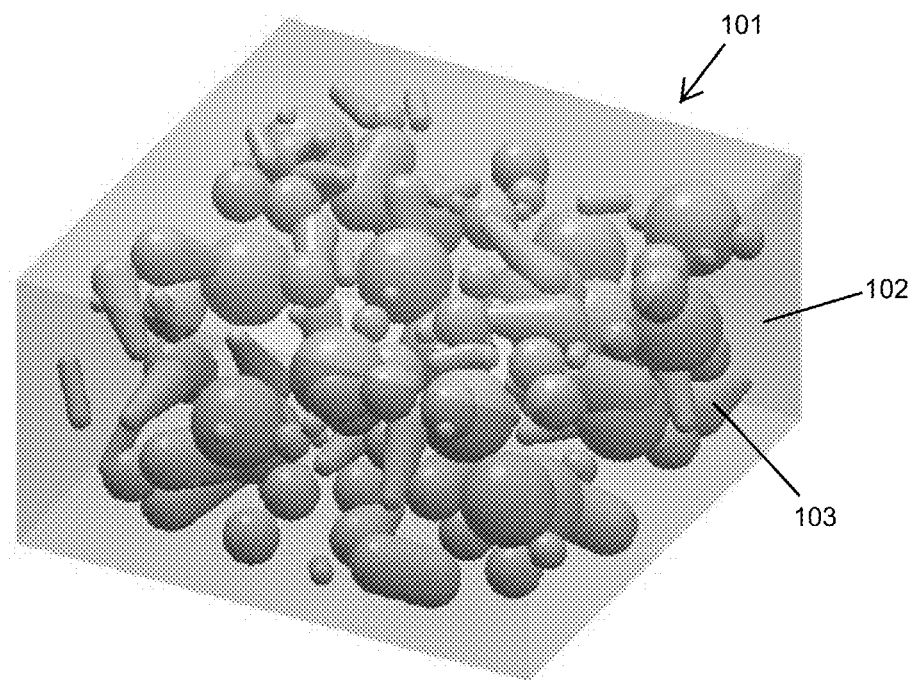
FIGS. 1A-1C show the composite according to several embodiments.
Figure 1B:
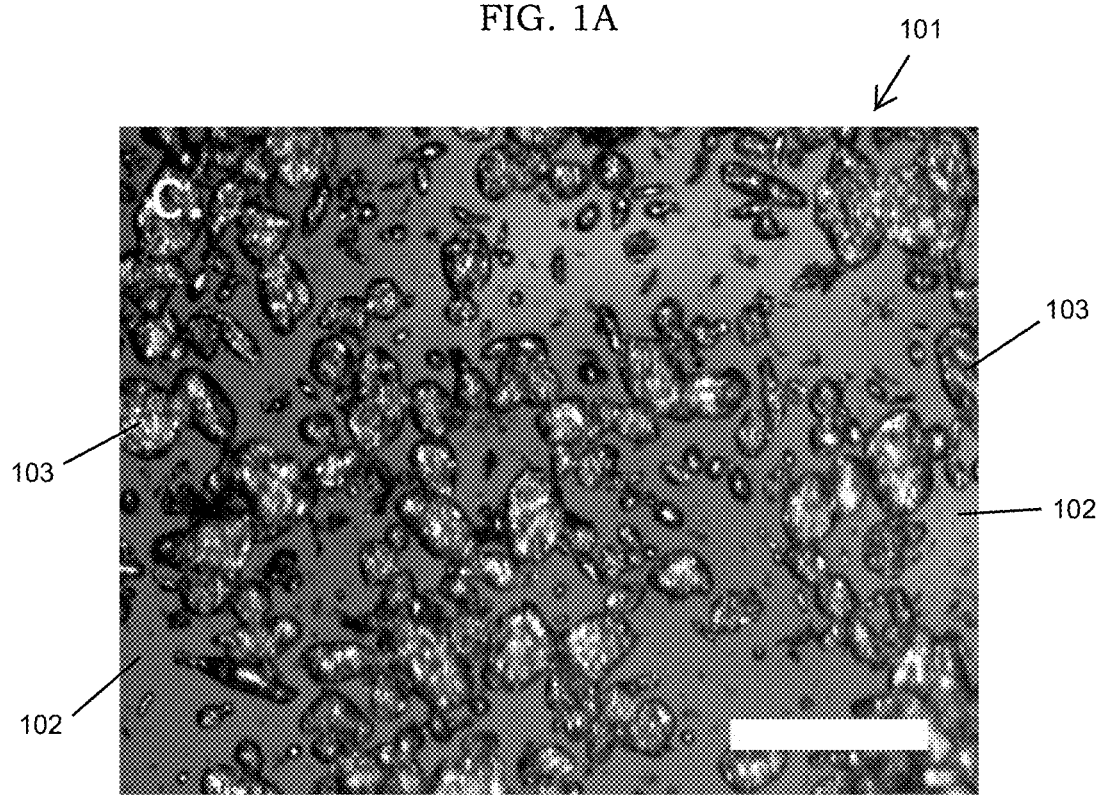
Figure 1C:
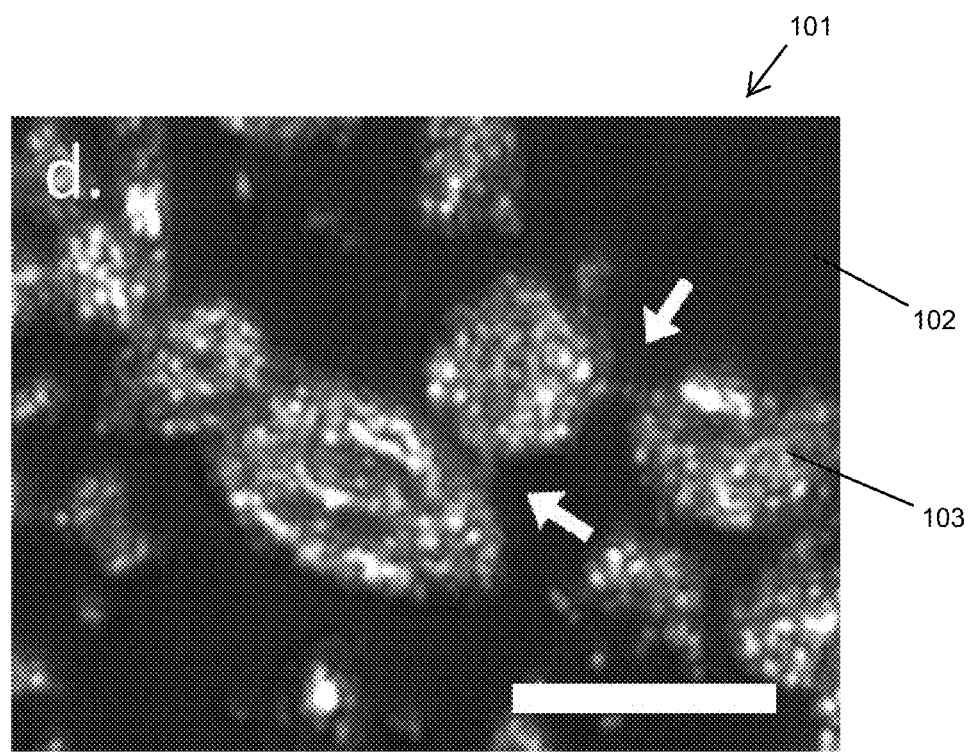
Figure 2A:
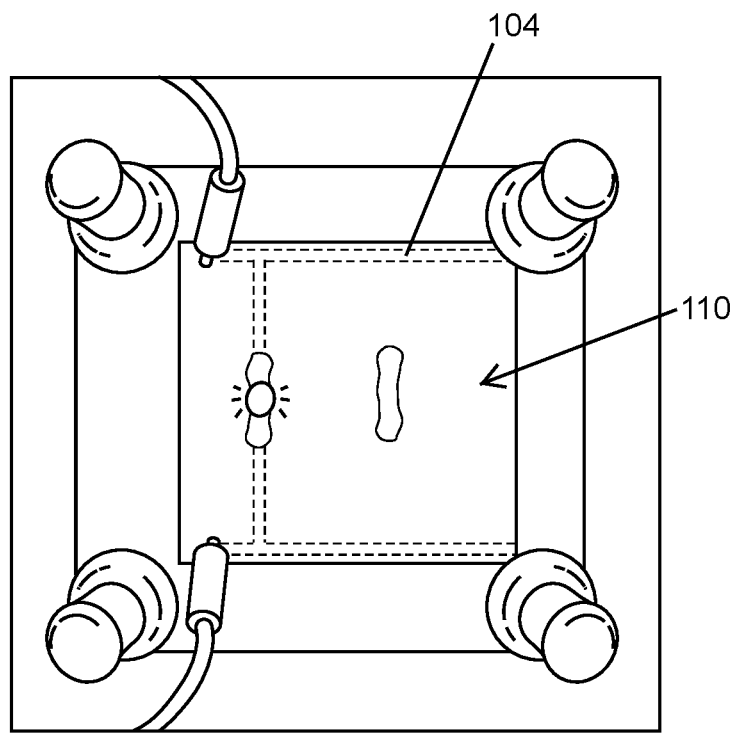
FIGS. 2A-2B are examples of circuits created from the composite.
Figure 2B:
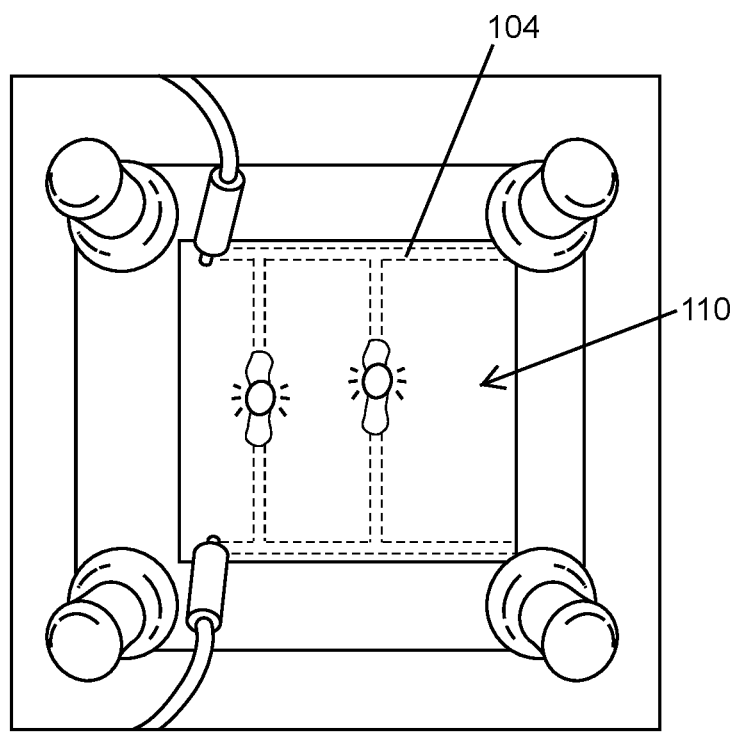
Figure 3:
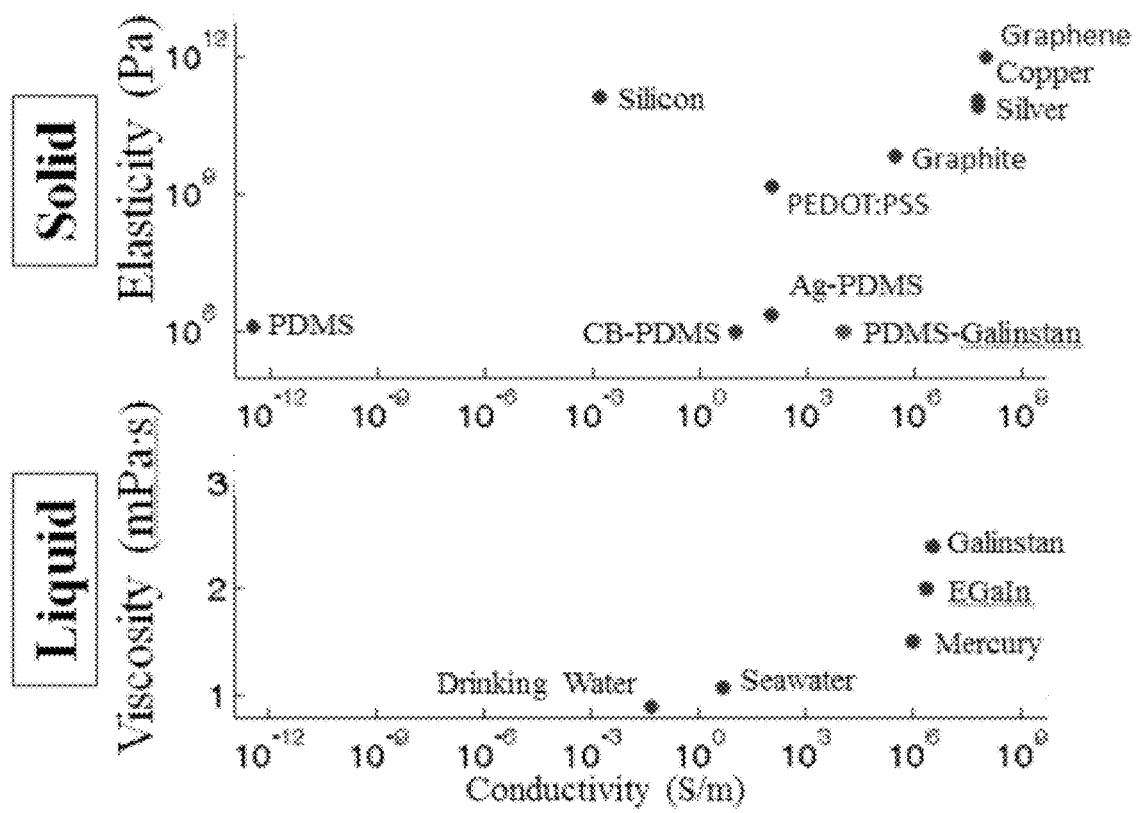
FIG. 3 is a graph comparing the elasticity and viscosity to conductivity of different materials.

In one example embodiment, the composite 101 comprises a thin sheet of poly(dimethylsiloxane) (PDMS) embedded with microscopic inclusions of liquid-phase gallium-indium-tin ("Galinstan"; electrical conductivity, $o=3.46\times10^6$ S*m$^{-1}$, melting point=$-19°$ C.) droplets 103. (See to FIGS. 1A-1C). In this embodiment, the PDMS/Galinstan composite 101 is not initially conductive, but concentrated surface pressure causes a permanent change in the composite's internal structure and bulk properties, resulting in a volumetric conductivity of $\sigma=1.05\times10^4$ S*m$^{-1}$. Because of this, it is possible to selectively induce conductivity in a sheet of the material, allowing simple circuits to be drawn onto the composite 101, as shown in FIGS. 2A-2B. Since the conductive inclusions 103 are liquid-phase, the bulk material is still highly soft (Young's modulus, E=0.90-1.27 MPa) and elastic, with a strain to failure of $\varepsilon_f=133\%$ strain (i.e. over twice its natural length). The modulus of the composite 101 is similar to that of natural human skin (0.4-0.8 MPa) and an order-of-magnitude less than striated muscle (~10-50 MPa). This biomechanical compatibility allows the composite 101 to easily conform to the contours of the human body and stretch as the body moves for applications involving wearable technology. Additionally, while under tension the resistance remains approximately constant so that the properties of the circuit are unaffected. Compared to other conductive elastomers using solid phase fillers and having a similar modulus (i.e. carbon black-PDMS and Ag-PDMS with E~1 MPa), this composite 101 exhibits orders of magnitude greater volumetric conductivity, as shown in FIG. 3.

Figure 4:
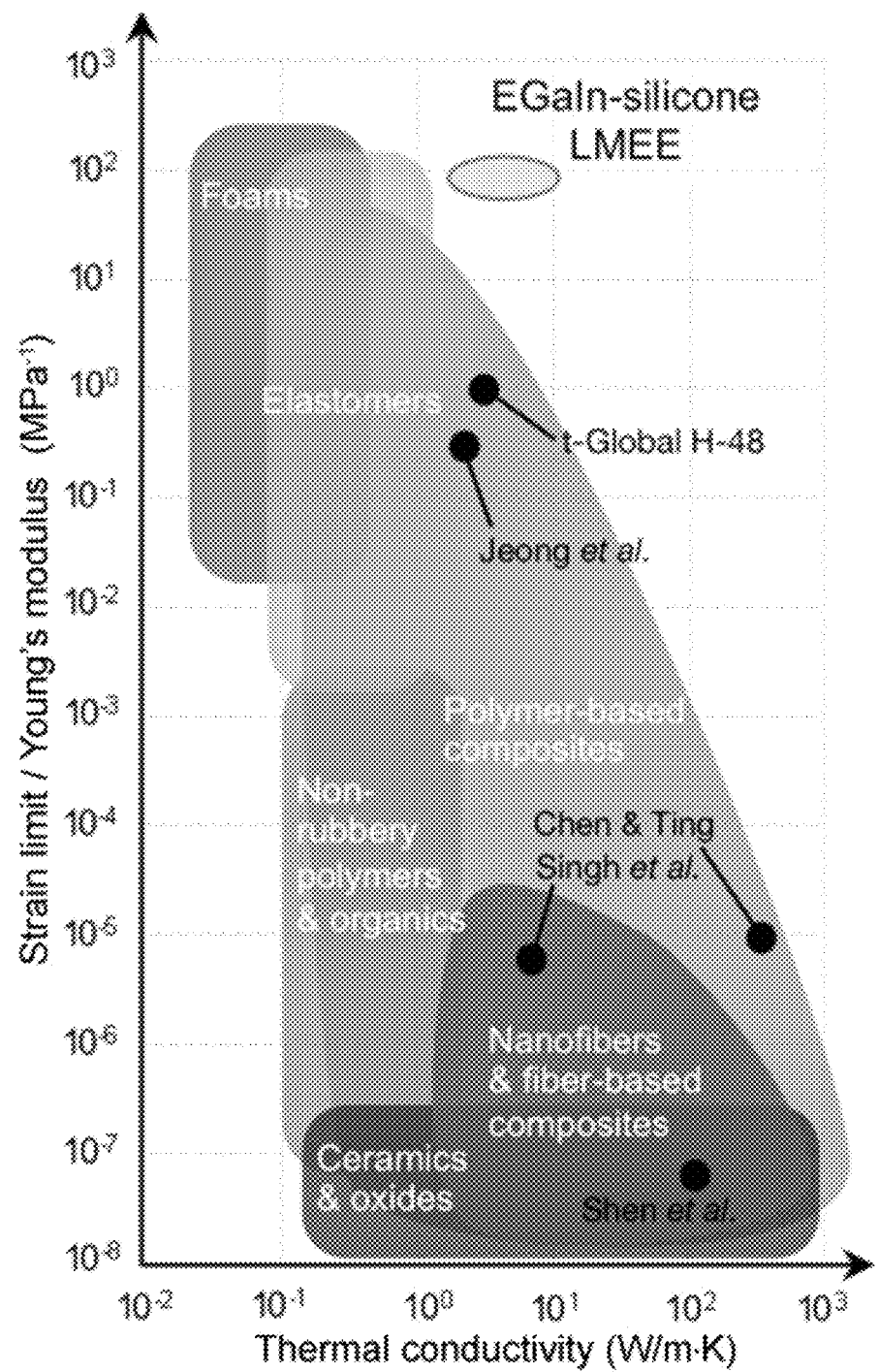
FIG. 4 is a graph comparing the thermal conductivity of the composite, according to one embodiment, to different materials.

In another example embodiment, the liquid metal embedded elastomer composite 101 comprises a Pt-catalyzed silicone elastomer 102 embedded with a randomly distributed, polydisperse suspension of non-toxic, liquid-phase eutectic gallium-indium (EGaIn) microdroplets 103. In this embodiment of the composite 101, strain creates thermally conductive pathways through the in-situ elongation of the deformable liquid metal inclusions 103, which significantly enhances thermal conductivity in the stretching direction. For permanent (stress-free) and strain-controlled elongation of the liquid metal inclusions 103, this enhanced k is nearly 25-50× greater than the unfilled elastomer (0.20±0.01 W/m·K) and approaches the limit for the parallel rule of mixtures of an EGaIn-silicone composition without the aid of percolating networks. Referring to FIG. 4, the exceptional combination of thermal conductivity, low elastic modulus, and high strain limit allows the LMEE composites 101 to occupy an uncharted region of the material properties space.

Fabrication of the elastomer composite 101 comprises mixing the elastomer 102 and liquid metal 103 to ensure an even distribution of the liquid metal 103 within the elastomer 102. During mixing, the liquid metal 103 can form droplets suspended in the elastomer 102. Depending on the intended application, the components can be mixed until the metal droplets 103 are reduced to a desired size.

In one example embodiment, a composite 101 is fabricated by mixing Galinstan (Ga 68.5%, In 21.5%, Sn 10% by weight) with uncured PDMS (Sylgard® 184) using mixing techniques known in the art, such as with a mortar and pestle or through sonication. In this example embodiment, the ratio of the two materials is 1:1 by volume (6.6:1 Galinstan to PDMS by weight) and they are mixed until the Galinstan droplets are 2-30 μm in size, as shown in FIGS. 1B-1C. Because of its relatively high concentration, the Galinstan liquid metal 103 exhibits uniform dispersion and remains suspended within the PDMS elastomer 102 despite the dramatically different densities of the two components. For materials with low volume percent liquid metal 103, a higher concentration mixture is prepared first and diluted with the addition of further polymer 102. After curing on a hotplate at 150° C., the droplets of Galinstan liquid metal 103 are temporarily encapsulated in a closed-cell foam-like matrix of the PDMS elastomer 102.

To mix via sonication, in an alternative embodiment, the elastomer 102 (PDMS) and liquid metal 103 (Galistan) are combined at a weight ratio of 0.9 g to 6.6 g in a sealable polypropylene jar. Hexane (anhydrous, 95%) is the added, using 8 mL for a mixture of 1.8 g elastomer 102 and 13.2 g Galinstan. To distribute the polymer 102 and metal 103, the jar is sealed and shaken vigorously, before being placed in a bath sonicator (i.e. Branson B1510) for several hours. The mixture is checked periodically to ensure that the metal droplets 103 are not settling out. The mixture can be stirred or agitated to redistribute the components, if necessary. After several hours, the lid is removed, sonication continuing until the hexane evaporates. Once solvent free, the elastomer 102 curing agent is added (0.1 g per 0.9 g base) via stirring. This stirring will also disperse any large droplets 103 that have settled to the bottom of the jar. The PDMS-Galinstan composite 101 can then be formed to a desired shape.

Figure 5:
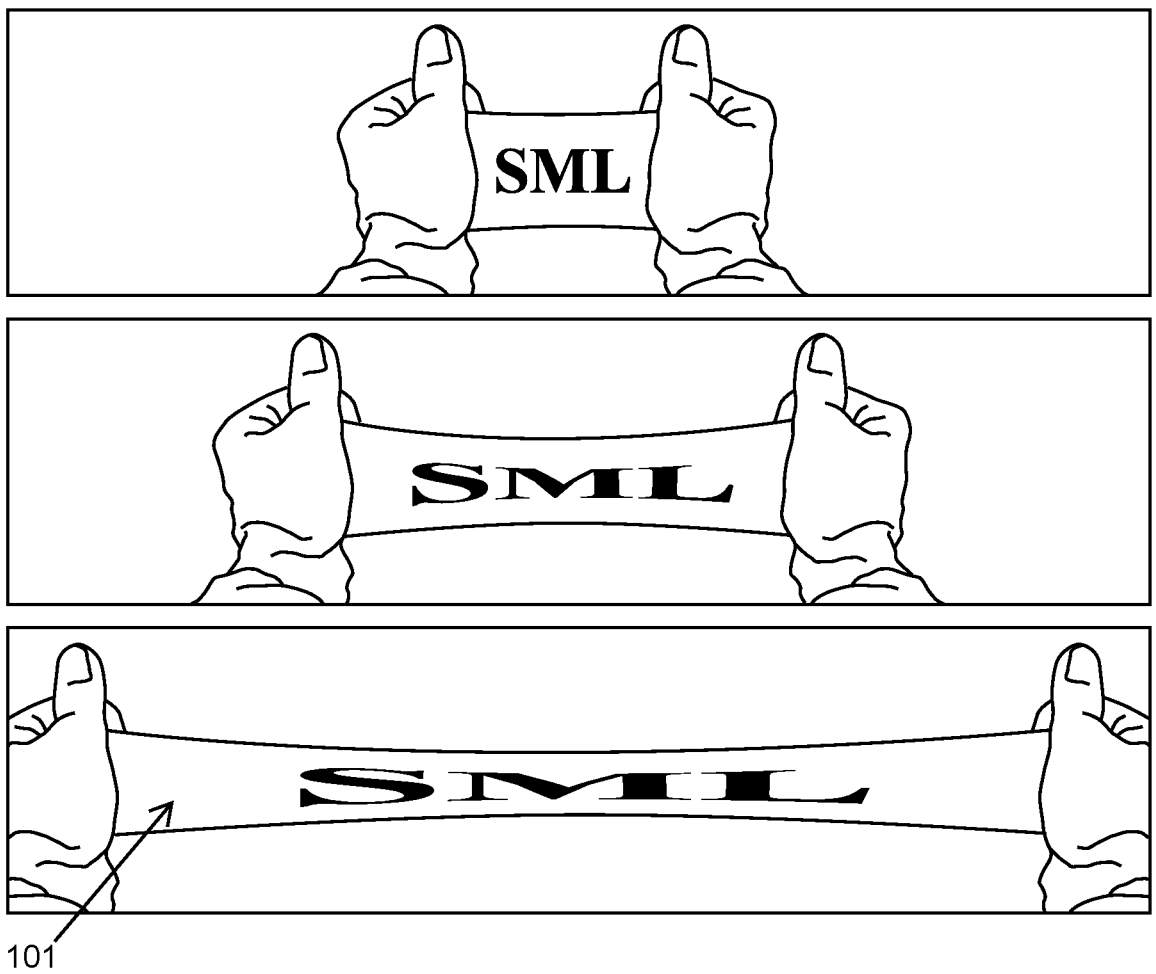
FIG. 5 is an image of the composite according to one alternative embodiment.

Because the composite 101 is a thermoset with a long working time (≥30 min), multiple fabrication techniques can be used to pattern liquid metal materials, including 3D printing, soft lithography, laser ablation, or stencil lithography techniques. Thin films can also be prepared and, as an example, a stencil patterned EGaIn-silicone composite 101 is presented in FIG. 5.

In a bulk virgin state, the closed-cell geometry of the composite 101 prevents conductivity between adjacent liquid metal inclusions 103. However, applying concentrated mechanical load, most notably through localized compression, causes the elastomer composite 101 to exhibit volumetric conductivity. Applying pressure to the composite 101 causes tearing or rupturing of the cell walls and the formation of a continuous network of Galinstan droplets (see FIG. 1C, where the arrows show connectivity between adjacent droplets 103). More specifically, the compression forms a conductive channel 104 within the composite 101, as shown in FIGS. 2A-2B. In contrast to pre-fabricated open-cell polymer nano-networks, the composite 101 has no pre-defined foam structure and can be patterned for selective conductivity through the application of concentrated surface pressure.

Figure 6:
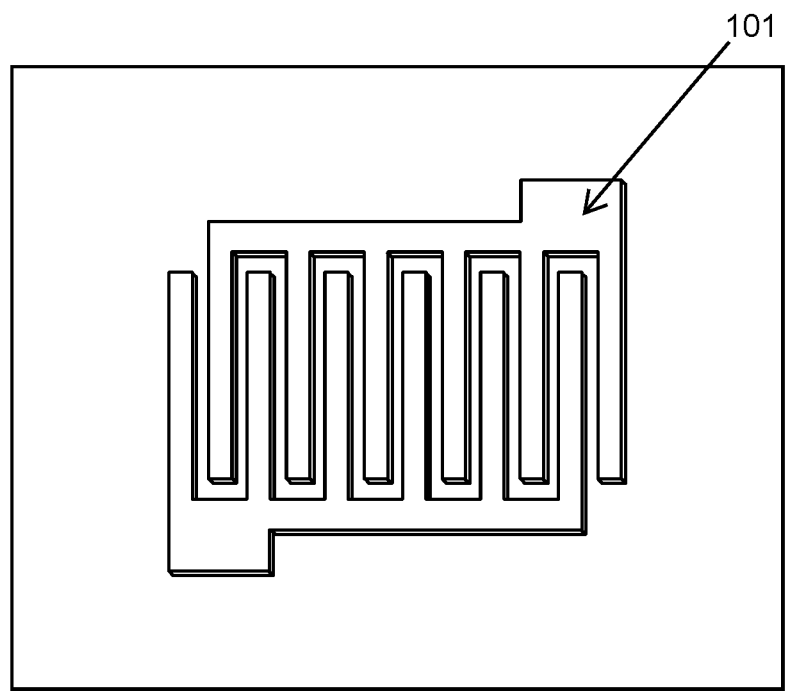
FIG. 6 is an example circuit created from the composite.

In one embodiment, the final composite 101 can be prepared using stencil lithography (mask depositon). Laser tape and backing is patterned using a laser cutter and placed tape side down onto a metal substrate prepared with mold release. An applicator is used to distribute the uncured composite 101 over the laser tape mask. Afterwards, the mask is removed and the metal substrate is placed on a hot plate set to 150° C. to cure for at least 1 hour. The cured composite 101 can then be removed with tweezers. An example of a comb capacitor with 1 mm wide fingers and gaps made through the mask deposition process is shown in FIG. 6.

In an alternative embodiment, the composite 101 was fabricated with a 100 μm layer of elastomer 102 on the top and bottom surface, this layer deposited before and after the composite 101 using the thin film applicator. To induce conductivity, the composite 101 is placed between two 0.05 mm sheets of copper and a 9.5 mm steel rod is rolled along the surface. Similarly, the tip of a ball-point pen can be used directly on the surface to target select regions for conduction activation. With a conductive layer of composite 101 disposed between two non-conductive layers of elastomer 102, a flexible capacitor is created.

In yet another embodiment, the composite 101 is prepared by mixing the liquid metal 103 (eutectic Ga—In (EGaIn) alloy (75% Ga-25% In, by wt.) with uncured liquid silicone elastomer 102 (Ecoflex® 00-30, Smooth-On) or polyurethane (Vytaflex® 30, Smooth-On) at volume loadings ($\phi$) of liquid metal 103 from 0 to 50%. In this embodiment, EGaIn is selected as the liquid metal 103 due to its low melting point (MP=15° C.), high electrical conductivity ($\sigma$=3.4×106 S/m), low viscosity ($\eta$=2 mPa·s), and low toxicity (compared to Hg). Additionally, EGaIn oxidizes in air to form a ~1-3 nm thick $Ga_2O_3$ skin that allows the liquid droplets 103 to be broken apart and dispersed in solution without the need for emulsifying agents.

Optical microscopy and 3d X-ray imaging have shown a disordered but statistically uniform dispersion of liquid metal droplets 103 and the absence of percolating networks that could result in electrical conductivity or shorting. (See FIG. 1B). The microdroplets 103 are also generally ellipsoidal-shaped with dimensions measured through two dimensional particle analysis on the order of ~4-15 μm, in this embodiment.

Figure 7A:
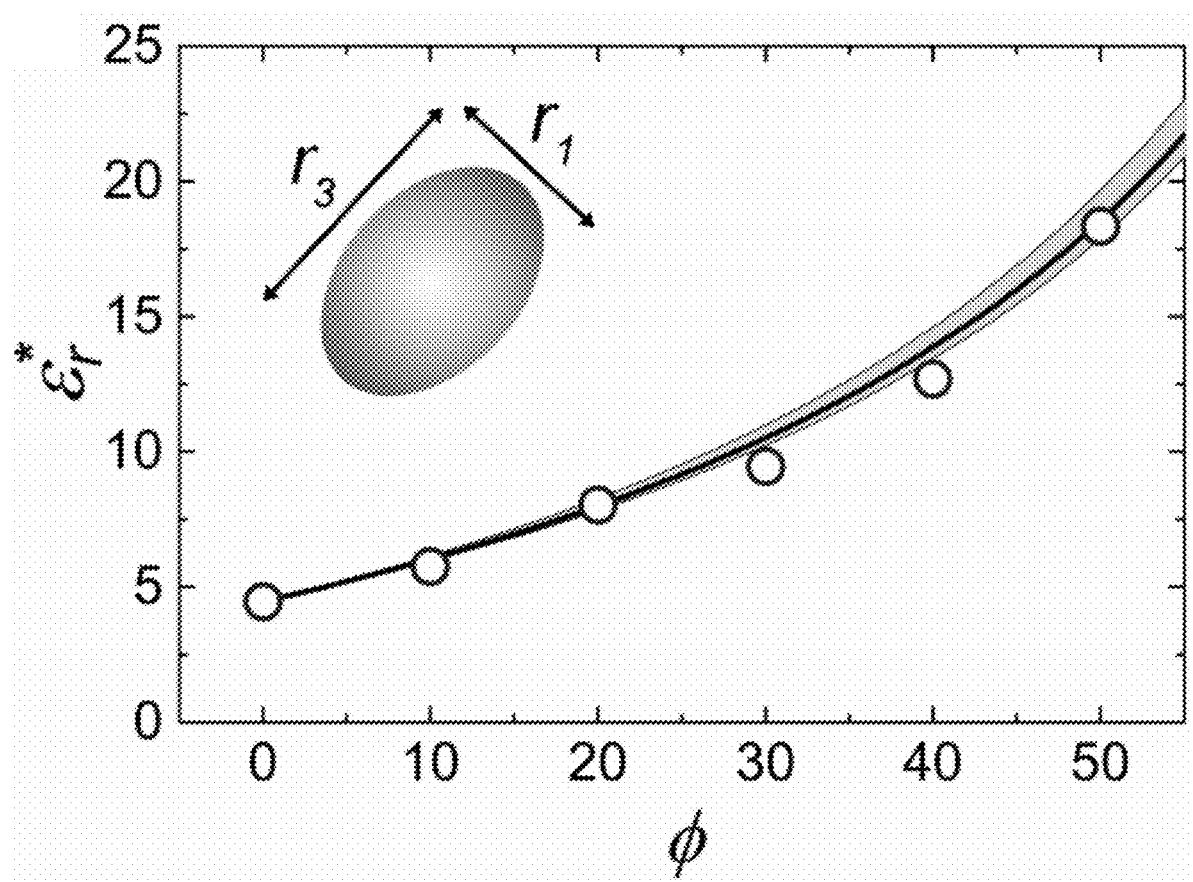
FIGS. 7A-7C are graphs depicting various electrical properties of the composite.
Figure 7B:
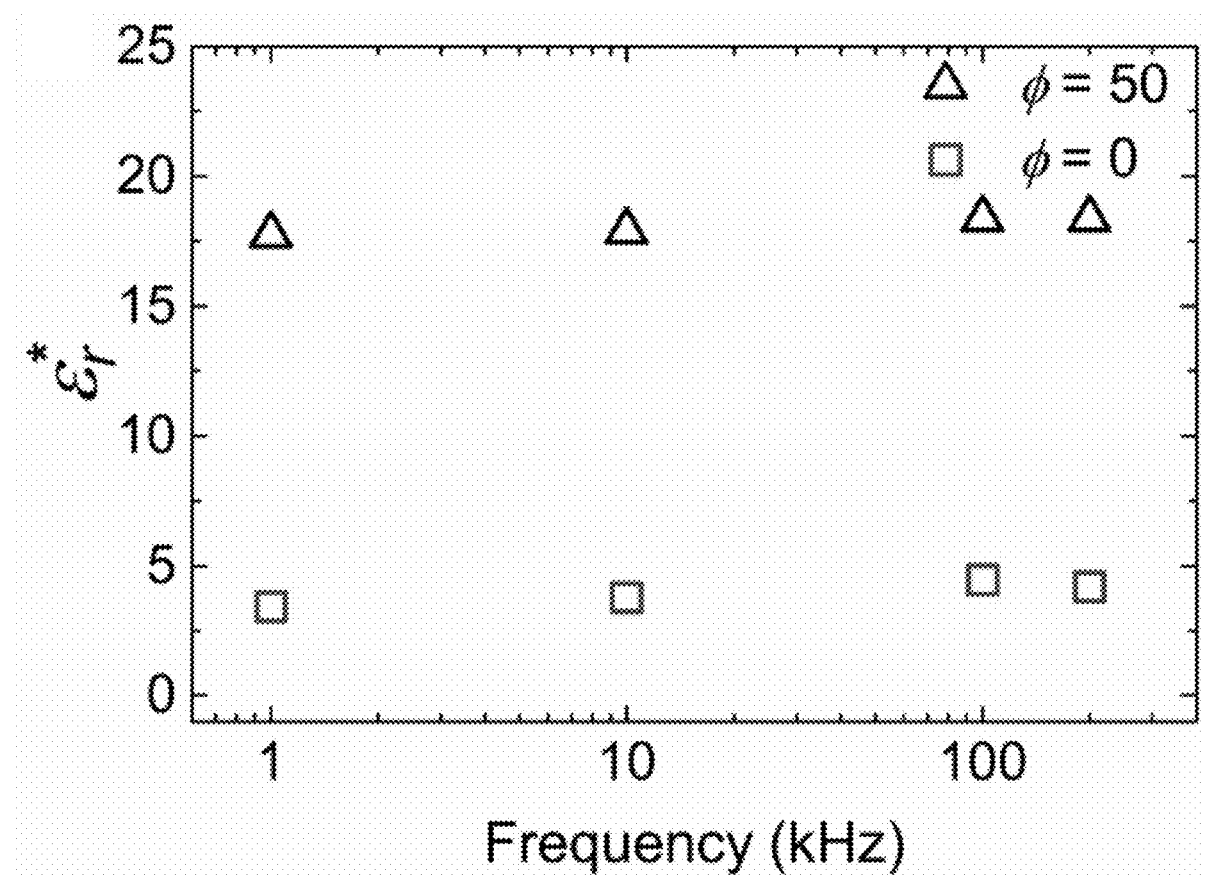
Figure 7C:
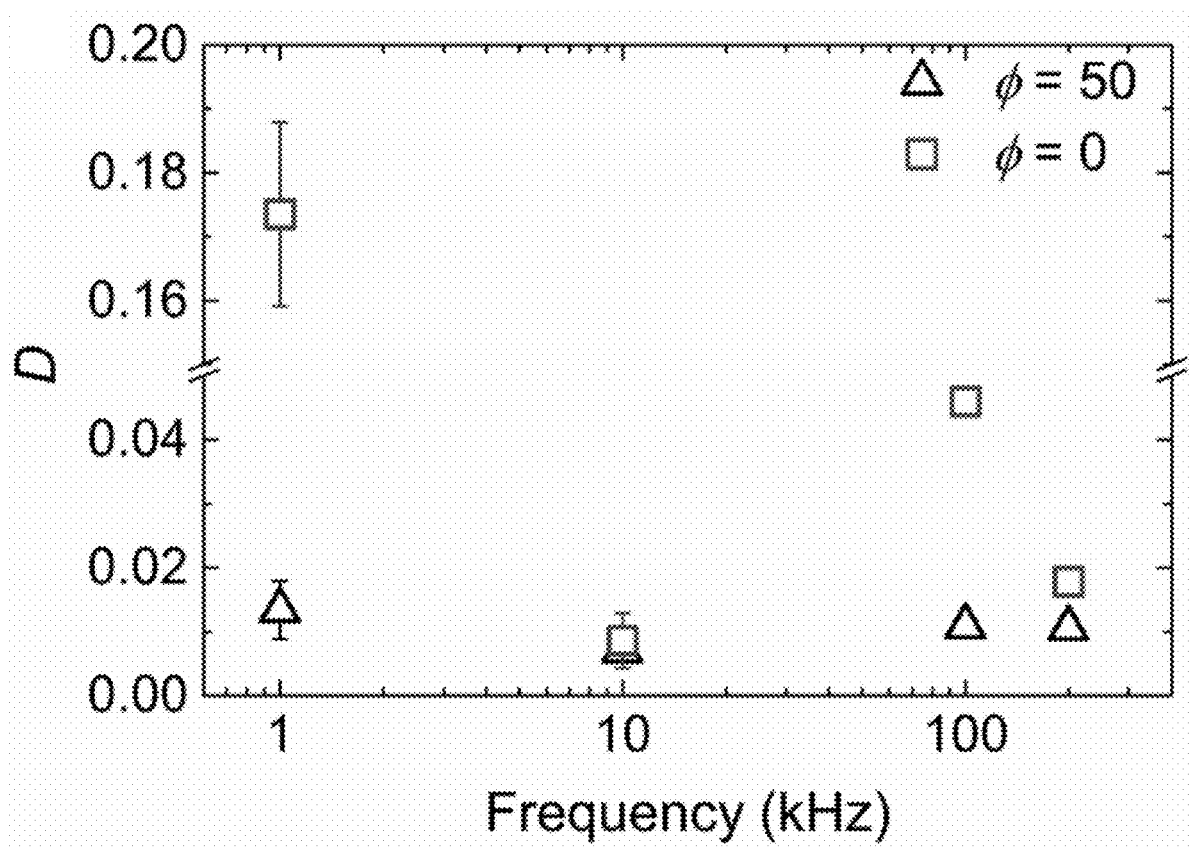

The electrical polarizability of the LMEE composites 101 is crucial for their use as soft, stretchable electronic components. FIG. 7A presents a plot of effective relative permittivity $\varepsilon_r^*$ versus $\phi$ for an EGaIn-silicone composite 100 at a frequency of 100 kHz and 0% strain. The plot shows that as the concentration of liquid metal 103 is increased, the effective relative permittivity increases nonlinearly. For the silicone system, the effective relative permittivity of the sample with $\phi$=50% increases to over 400% as compared to the unfilled system over the entire 1-200 kHz frequency range (FIG. 7B). In order to evaluate the ability of the dielectric to store charge, the dissipation factor (D) is measured for the same range of frequencies (FIG. 7C). Also called the loss tangent, D corresponds to the ratio of electrostatic energy dissipated to that stored in the dielectric. For LMEEs composite 101, the dissipation factor is measured to be similar to or less than that of the unfilled material (D<0.1) and well within the threshold for dielectric functionality. In contrast, many high-k composites enhanced with conductive particulates (such as Ag, Al, and CB) become lossy and demonstrate large D values due to non-negligible electrical conductivity at volume fractions on the order of 30%.

For applications where thermal conductivity is required, the composite 101 according to one embodiment can exhibit a combination of high thermal conductivity (4.7±0.2 W/m·K under stress-free conditions; 9.8±0.8 W/m·K at 400% strain) with a low modulus (89±2 kPa after 200% pre-strain) and high strain limit (>600%). This approach overcomes the Newton-Laplace scaling since the inclusions have a thermal conductivity that is dominated by electrons, rather than phonons, and can deform with the surrounding matrix to support strain and thermal-mechanical coupling. Previously, it was shown that LM-embedded elastomer composites 101 can be engineered to exhibit dramatic enhancements in electrical permittivity and conductivity without sacrificing the elastic properties of the matrix elastomer. Others have designed materials that suffer from increased stiffness or lower thermal conductivity. Comparing previous results with the performance of the composite 101 (see FIG. 4) highlights the critical importance of composite's microstructure (and not just material composition) in enabling elastomers to exhibit metal-like thermal conductivity without altering their natural elasticity.

To assess the performance of the composite 101, thermal conductivity is measured using the transient hotwire (THW) method in which an embedded wire simultaneously acts as a resistive heat source and thermometer that measures the change in temperature ($\Delta T$) as a function of time (t), which are related to thermal conductivity through the cylindrical heat diffusion equation. Experimental measurements are presented in FIG. 8, which show that as LM 103 volume fraction ($\phi$) increases thermal conductivity increases.

This configuration enables examination of the thermal-mechanical coupling between thermal conductivity and deformation. Upon stretching the unfilled ($\phi$=0%) homogenous elastomer, the thermal conductivity in the direction of stretch ($k_y$~0.20 W/m·K) remains largely unchanged (FIG. 12). However, when stretching the $\phi$=50% LMEE, the thermal conductivity in the longitudinal direction ($k_y$) dramatically increases and reaches a value of 9.8±0.8 W/m·K at 400% strain. This represents an increase of ~50× relative to the unfilled material and a value that approaches the thermal conductivity of some metals like bismuth and stainless steel. In addition, the material is robust to cyclical loading, with only a slight increase in thermal conductivity measured after 1000 cycles of 200% strain.

Figure 8:
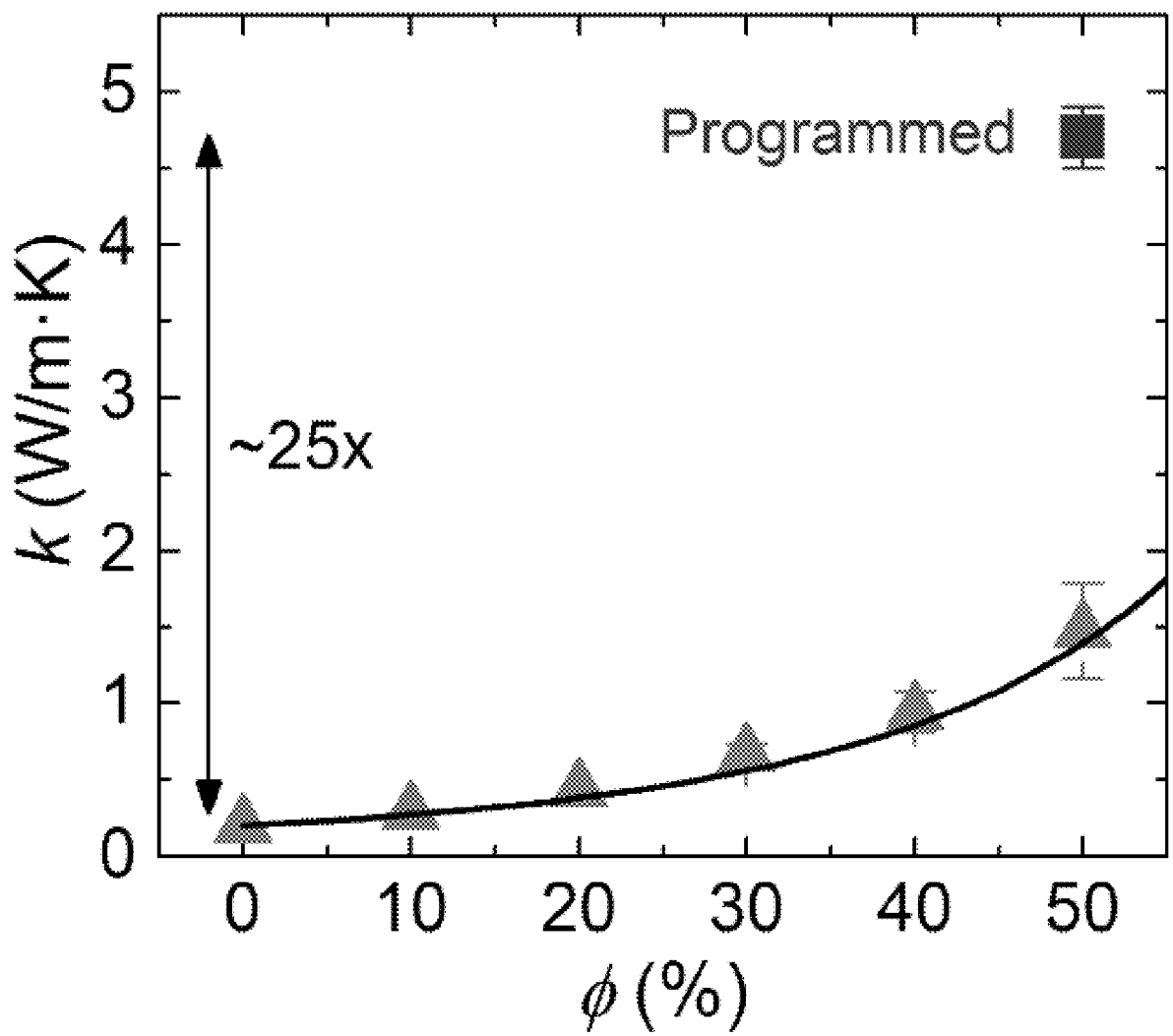
FIG. 8 is a graph depicting thermal conductivity properties of the composite.
Figure 13:
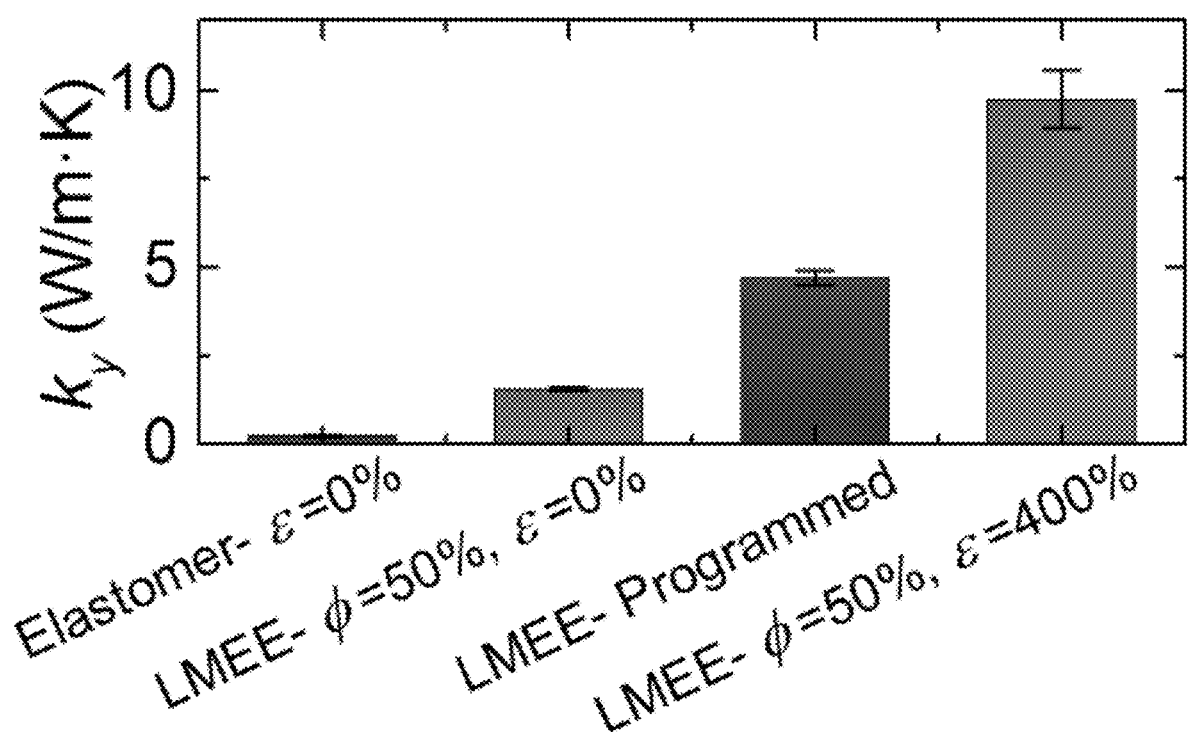
FIG. 13 is a graph showing the thermal conductivity of various composites and other materials.

Furthermore, the composite 101 can be "programmed" to achieve permanently elongated liquid metal 103 inclusions in a stress-free state by stretching a virgin sample of composite 101 to 600% strain and then unloading to zero stress. An unrecoverable plastic strain of 210% is induced, enabling elongated inclusions 103 in an un-loaded (stress-free) state. As shown in FIG. 8, thermal conductivity of the programmed composite 101 in the longitudinal direction ($k_y$) is 4.7±0.2 W/m·K, which is ~25× greater than that of the base elastomer 102 (FIG. 13). It is important to note that when unstrained, both the φ=0 and 50% composites 101 exhibit values of k that are typically observed in other polymeric composites.

Such an unprecedented enhancement in k arises from the discovery of a unique thermal-mechanical coupling in which the deformable liquid metal inclusions 103 elongate into needle-like microstructures along the pre-strained or mechanically loaded direction to create enhanced thermally conductive pathways. When composites 101 with φ=30% and 50% liquid metal 103 (by vol.) are subjected to strains ranging from 0% to 400% in increments of 100%, the thermal conductivity in the y (stretching) direction increases by greater than a factor of five beyond 300% strain.

The observed anisotropic thermal-mechanical response is controlled by the directional change in aspect ratio of the liquid metal inclusions 103. Lastly, for all volume fractions, the composite 101 materials have an elastic modulus less than 90 kPa and can support uniaxial strains above 600%, properties that are similar to that of the homogeneous elastomer. The modest increase in elastic modulus (<20%) for the composites 101 can be attributed to surface tension at the liquid-solid interface.

As previously described, electrical conductivity can be induced in the composite 101 through compression, which causes the liquid metal inclusions 103 to coalesce within the elastomer 102. To assess the pressure-controlled transition from the non-conductive virgin state to a permanently conductive state, the composite 101 is compressed using a 3.2 mm diameter cylindrical probe. The resistance through the axis of loading is then measured. On average, conductivity is initiated with a surface pressure of 1.7 MPa (n=5 samples). Increasing the compressive stress causes the conductivity to monotonically increase due to further degradation of the closed-cell matrix structure. In addition to concentrated loading, conductivity can also be permanently induced by pressing and rolling a rigid cylinder into the sample, altering the electrical properties of the entire composite 101. In both cases, compression causes the material to darken and trace amounts of liquid metal 103 are sometimes observed to appear on the surface of the composite 101. Coating the material in a thin layer of elastomer 102 prevents this outflow of the liquid metal 103. Tension can also induce conductivity, but this occurs at very large strains that are close to the failure limit of of the material. Once compressed, the conductivity of the composite 101 is 1.05× $10^4$ S*$m^{-1}$ and exhibits unique electromechanical coupling.

Figure 9A:
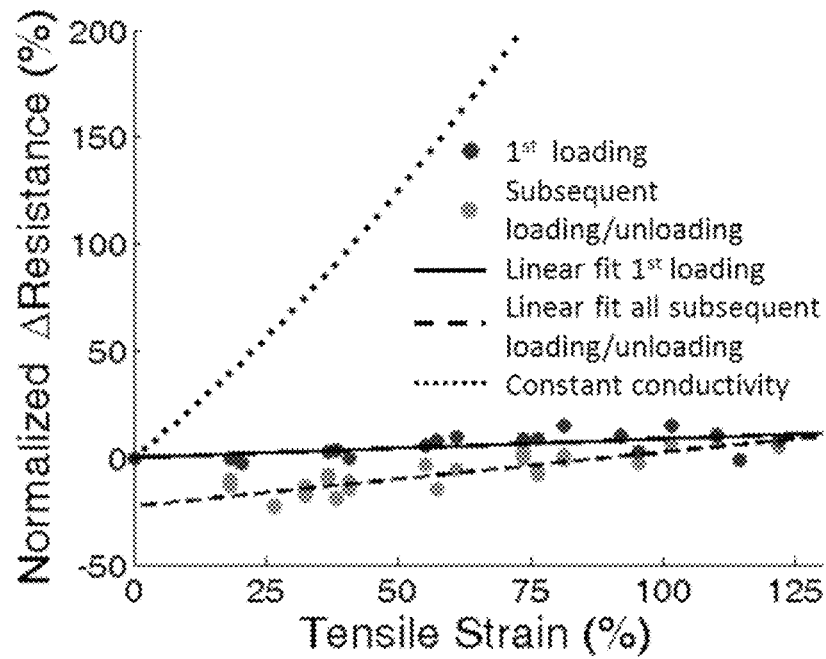
FIGS. 9A-9B and FIGS. 10A-10C are graphs showing properties of the composite at various tensile strain.
Figure 9B:
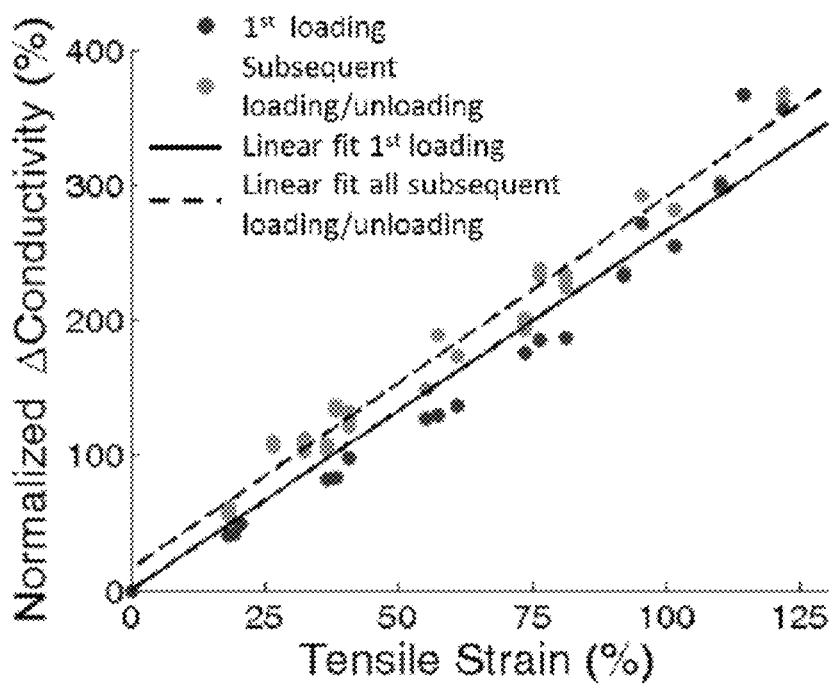

When loaded in tension, the electrical resistance R through the length of the composite 101 undergoes only modest increase, which implies that the volumetric conductivity σ=L/RA increases significantly with load (FIG. 9A-9B). Here, L is the stretched length of the specimen and A is its cross-sectional area. Since the composite 101 is entirely composed of incompressible fluid 103 and elastomer 102 (with no observed voids or air pockets), the composite 101 is assumed to be incompressible, which implies that $A=A_0/\lambda$, where $\lambda=L/L_0$ is the stretch and $L_0$ and $A_0$ are the natural (unloaded) length and cross-sectional area of the composite 101. In contrast, a homogenous material with a constant bulk conductivity $\sigma=\sigma_0$ would exhibit a relative increase in electrical resistance $\Delta R/R_0=\lambda^2-1$, where $R_0=L/\sigma_0 A$ is the resistance of the specimen prior to stretch (dotted line in FIG. 3a). The invariance of $\Delta R/R_0$ to stretch that we observe with the composite suggests that the conductivity is achieved through a preserved network of electrical contacts between embedded liquid metal droplets 103.

Three samples were elongated to 30 mm four times, with repeated stretching showing only a modest increase in conductivity. The greatest change in volumetric conductivity occurred after the first loading, with the dependence of σ on λ remaining similar in the subsequent unloading and loading of a sample.

Figures 10A, 10B, 10C:
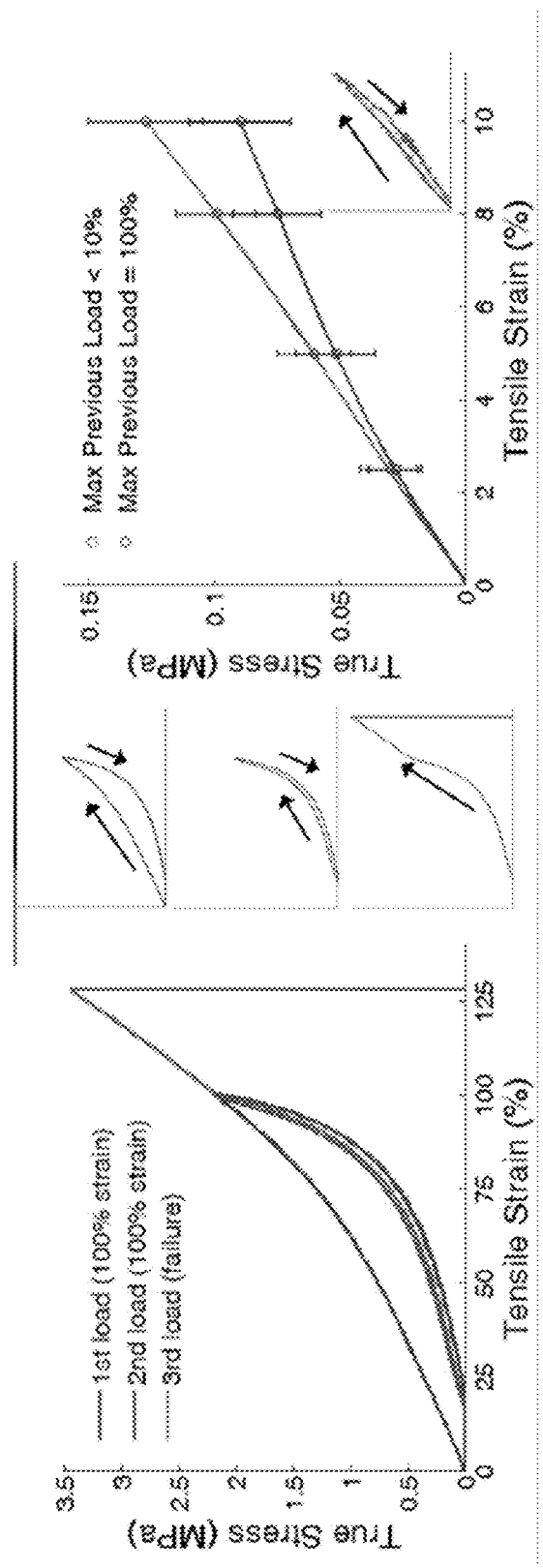

Tensile tests were performed on the composite 101 and reveal highly nonlinear elastic deformation. As before, the assumption of incompressibility is used to calculate cross-sectional area and true stress. Large strains (100%) of a virgin specimen show strain hardening while loading, with a dramatic decrease in mechanical resistance during unloading (FIG. 10A-10C). Interestingly, if the composite 101 is reloaded to this same high strain, the stress-strain curve will be similar to that of its previous unloading: a reduced initial stress response with strain hardening occurring as the composite's maximum previous load is achieved. Straining the composite 101 further continues the response seen in the virgin material, as well as alters its response to future loadings (by adjusting the maximum previous load). This effect was found to be permanent, correlating to inelastic elongation of the composites 101 at these high strains. Additionally, it mirrors the same hysteretic response observed in the electrical properties, with the maximum previous mechanical load determining the subsequent volumetric conductivity. This observation provides further evidence for the postulate that deformation of the composite 101 alters its interior structure. The elastic modulus measured up to 10% strain of the virgin material was measured to be 1.27 MPa. If the composite 101 had been previously strained to 100% its original length, this 10% strain modulus drops to 0.90 MPa. Compressing the material to induce conductivity causes a similar decrease. When compared to the Young's modulus of plain PDMS (2.59 MPa when cured at 150° C.), adding Galinstan decreases the stiffness. This is not surprising since the liquid inclusions make up 50% of the composite volume and should have negligible mechanical resistance to stretch. Elongation at break was found to be $\varepsilon_f$=133% strain on average, allowing for high stretchability in devices made with this material.

These LMEE composites 101 are also able to undergo significant deformations. The LMEEs composites 101 are able to stretch to strains on the order of 600%, similar to that of the unfilled elastomer. The composite also exhibits very little hysteresis when comparing the loading and unloading curves. This suggests negligible internal friction and losses due to viscoelasticity.

The electrical response to mechanical deformation is a significant parameter for stretchable dielectrics. FIGS. 11A-11B present results for the electrical permittivity and electromechanical coupling of EGaIn-silicone composites (φ=50%). Measurements are performed on a stretchable parallel-plate capacitor composed of a composite 101 and EGaIn electrodes sealed in an additional layer of silicone elastomer 102. The normalized capacitance, $C/C_0$, where $C_0$ is measured at 0% strain, increases under tensile loading until the composite 101 fails at over 700% strain.

It is observed that as the composite 101 is loaded in tension the capacitance increases by a factor of over 4.5 while the dielectric constant decreases from 18 to 9 when stretched from 0% to 700% strain. To further study the durability of the composite 101 as a dielectric material cyclic testing experiments were performed to 100% strain under tensile loading over 100 cycles (FIG. 11B). During the experiments the capacitance increased slightly at both 0 and 100% strain during the first 10 cycles, but then stayed constant until the test is completed at 100 cycles. The ability to undergo significant strain over 100 cycles without degradation of the electrical or mechanical properties further demonstrates the composite 101 as stretchable dielectric material.

In addition to exploring composites 101 with silicone elastomers 102, the composite's 101 behavior was also investigated using polyurethane elastomer 102 matrixes at high volume loadings (ϕ=50%). Compared to the silicone elastomer 102, the polyurethane-based composite 101 has a higher elastic modulus (E=780 kPa) and a lower average strain to break of 182%. However, the dielectric constant of the polyurethane composite 101 is found to be greater. Therefore, if extreme strains and moduli on the order of 100-200 kPa are not required, the general strategy developed for silicone-based composites 101 can be extended to polyurethane-based composites 101. The dielectric constant across the frequency range from 1-200 kHz for the polyurethane-based composites 101 at ϕ=50% is above 42. Additionally, the dissipation factor is below 0.1.

Referring again to FIGS. 2A-2B, the ability to selectively induce conductivity is highlighted with a simple circuit created using a ball point pen (0.8 mm diameter; 3.6 MPa of required pressure) and a square shaped sample of the composite 101. Electrical terminals and interconnects can be formed by drawing lines onto the surface of the sample, as seen for the LED circuit in FIGS. 2A-2B. Connections made in this way have low electrical resistance due the composite's 101 high conductivity. Multiple unconnected traces on a single sheet of the composite 101 can also function as a capacitor, as electricity is not transferred through the non-compressed region of the material. Spiral geometries can be used if inductance is desired. Circuits created in this fashion can be protected by casting a thick layer of soft polymer 102 on the top and bottom surface of the composite 101, so that compressive forces dissipate, reducing stress concentrations which can induce conductivity in unwanted regions.

While the disclosure has been described in detail and with reference to specific embodiments thereof, it will be apparent to one skilled in the art that various changes and modification can be made therein without departing from the spirit and scope of the embodiments. Thus, it is intended that the present disclosure cover the modifications and variations of this disclosure provided they come within the scope of the appended claims and their equivalents.

What is claimed is:

1. A composite consisting of:
an elastic polymer, and
a liquid metal,
  wherein the liquid metal is embedded within the elastic polymer to form a network of inclusions,
  wherein each inclusion of the network of inclusions has a diameter of about 2-30 μm,
  wherein the liquid metal has a melting point within the range of −19 degrees Celsius to 15 degrees Celsius,
  wherein the composite has a strain limit of at least 100%.
2. The composite of claim 1, wherein the elastic polymer is selected from the group consisting of polysiloxane, polydimethylsiloxane, silicone, polyurethane, polyacrylate, natural latex rubber, block copolymer elastomers, styrene ethylene butylene styrene, thermoplastic elastomers, and propylene-ethylene co-polymer.
3. The composite of claim 1, wherein the liquid metal is selected from the group consisting of eutectic gallium indium and gallium-indium tin.
4. The composite of claim 1, wherein the liquid metal is a eutectic alloy.
5. The composite of claim 1, wherein a conductive channel consists of an interconnected series of ruptured inclusions.
6. The composite of claim 5, wherein the conductive channel has a conductivity of about $1.05 \times 10^{\wedge}4$ S/m.
7. The composite of claim 1, wherein the network of inclusions is not conductive.
8. The composite of claim 1, wherein each inclusion of the network of inclusions are separated by at least a portion of the elastic polymer.
9. The composite of claim 1, wherein a volume loading of the liquid metal is about 10-50%.
10. The composite of claim 1, wherein the composite has a thermal conductivity of about 9.8 W/m*K at 400% strain.
11. The composite of claim 1, wherein the inclusions are elongated in a pre-strained direction.
12. A composite consisting of:
an elastic polymer, and
a liquid metal,
  wherein the liquid metal is embedded within the elastic polymer to form a non-conductive network of inclusions,
  wherein each inclusion of the network of inclusions has a diameter of about 2-30 μm,
  wherein the liquid metal is selected from the group consisting of gallium and gallium-based alloys,
  wherein the composite has a strain limit of at least 100%.
13. A method of fabricating the composite of claim 1, comprising:
combining the elastic polymer with the liquid metal,
  wherein the volume ratio of the elastic polymer to the liquid metal is 1:1;
mixing the elastic polymer and liquid metal until the liquid metal forms droplets suspending in the elastic polymer; and
curing the elastic polymer.
14. The method of claim 13, further comprising:
mixing the elastic polymer and liquid metal until the droplets have a diameter of about 2-30 μm.
15. The method of claim 13, wherein mixing the elastic polymer and liquid metal comprises shear mixing the elastic polymer and liquid metal using a mortar and pestle.
16. The method of claim 13, wherein mixing the elastic polymer and liquid metal comprises mixing the elastic polymer and liquid metal using sonication.
17. The method of claim 13, further comprising:
creating a pattern in the composite.
18. The method of claim 17, wherein the pattern is created by at least one of 3D printing, soft lithography, laser ablation, and stencil lithography.

* * * * *